United States Patent [19]
McClure

[11] Patent Number: 5,377,150
[45] Date of Patent: Dec. 27, 1994

[54] DISABLING SENSE AMPLIFIER

[75] Inventor: David C. McClure, Carrollton, Tex.

[73] Assignee: SGS-Thomson Microelectronics, Inc., Carrollton, Tex.

[21] Appl. No.: 99,947

[22] Filed: Jul. 30, 1993

Related U.S. Application Data

[63] Continuation-in-part of Ser. No. 40,916, Mar. 31, 1993.

[51] Int. Cl.$^5$ .............................................. G11C 7/02
[52] U.S. Cl. .................. 365/207; 365/189.05; 365/190; 365/189.02; 327/51
[58] Field of Search ............. 365/189.02, 190, 189.05, 365/207, 210; 307/530

[56] References Cited

U.S. PATENT DOCUMENTS

| | | | |
|---|---|---|---|
| 4,716,550 | 12/1987 | Flannagan et al. | 365/207 |
| 4,843,264 | 6/1989 | Galbraith | 307/530 |
| 4,891,792 | 1/1990 | Hanamura et al. | 365/189.05 |
| 5,068,830 | 11/1991 | Plants et al. | 365/190 |
| 5,099,452 | 3/1992 | Yamakoshi et al. | 365/210 |

Primary Examiner—Viet Q. Nguyen
Attorney, Agent, or Firm—Kenneth C. Hill; Lisa K. Jorgenson; Richard K. Robinson

[57] ABSTRACT

A memory system that includes a memory array having at least two pairs of data lines, first and second data lines that correspond to columns in the memory array. The memory array also includes two disabling sense amplifier circuits, a first disabling sense amplifier circuit connected to the first data lines and a disabling sense amplifier circuit connected to the second data lines, wherein the disabling sense amplifier circuits produce output signals and may be enabled and disabled. A selection signal is provided for selectively enabling and disabling the disabling sense amplifier circuits, wherein one pair of data lines may be selected. An amplification circuit connected to the disabling sense amplifier circuits provides for amplifying the output signals from the disabling sense amplifier circuits.

18 Claims, 7 Drawing Sheets

DISABLING SENSE AMPLIFIER

CROSS-REFERENCE TO RELATED APPLICATION

This application is a continuation-in-part of an application entitled "Multiplexing Sense Amplifier", Ser. No. 08/040,916, filing date Mar. 31, 1993 by the inventor hereof, and assigned to the assignee herein.

Applicant incorporates said application Ser. No. 08/040,916 by reference herein and claims the benefit of said application for all purposes pursuant to 37 CFR § 1.78.

BACKGROUND OF THE INVENTION

1. Field of the Invention

The present invention relates generally to the field of microelectronics and in particular to a method and apparatus for sensing signals from a memory array. Still more particularly, the present invention relates to a method and apparatus for selecting and sensing signals from a memory array.

2. Description of the Prior Art

Memories are devices that respond to operational orders, usually from a central processing unit (CPU) of a digital computer. A sense amplifier is typically employed to detect attenuated signals from a memory array. Two types of sense amplifiers are typically used: a static sense amplifier and a dynamic sense amplifier. Dynamic sense amplifiers are often used because they have low current consumption and the sense amplifiers are activated only when required to perform sensing functions.

Referring to FIG. 1, a memory array 100, a multiplexer 102, and a sense amplifier 104 are depicted in a configuration known to those skilled in the art. Memory array 100 contains a number of bit line pairs that may be accessed using word lines (not shown). Frequently in memory arrays, such as memory array 100, sense amplifier 104 is shared among many columns of the memory array. In addition, the data fed into sense amplifier 104 might be multiplexed between different blocks of columns within memory array 100. In the depicted example, left block 100a and right block 100b of memory array 100 share sense amplifier 104. Two pairs of data lines, LBT, LBC, RBT, and RBC originate from memory array 100 and are connected to multiplexer 102. Data lines LBT and LBC originate from left block 100a of memory in memory array 100; data lines RBT and RBC originate from right block 100b in memory array 100. Data lines LBT and LBC carry left block true and complement data signals respectively, while data lines RBT and RBC carry right block true and complement data signals respectively. Multiplexer 102 is used to select data from one pair of data lines and is connected to sense amplifier 104. Sense amplifier 104 may include a number of different stages.

Referring next to FIG. 2, sense amplifier 104 may include the following stages: level shifter 106, current mirror 108, and p-channel cross-coupled amplifier 110. A level shifter is typically employed to shift the voltage of the multiplexed signals in order to optimize the other stages of the sense amplifier. Typically, level shifter 106 is used to adjust the voltage of the signal selected by multiplexer 102 in order to optimize the performance of the other stages within sense amplifier 104. Sense amplifier 104 is employed to detect signals, in lines MUXC and MUXT, selected by multiplexer 102 from memory array 100. Typically, sense amplifier 104 includes p-channel cross-coupled amplifier 110 with a high common-mode rejection in order to reject picked-up interference due to cross-talk from other parts of the system.

With reference now to FIG. 3, a schematic diagram of a known multiplexer is illustrated. The multiplexer is constructed with transistors MA-MM. The transistors are p-channel metal-oxide semiconductor field effect transistors (MOSFETs). Multiplexer 102 is powered by connecting transistors ME, MG, MH, MI, MJ, and ML to power supply VCC. Points 111, 113, and 115 are points at which an equalization signal is applied to multiplexer 102.

Data from data line LBT is fed into the multiplexer 102 at input point 112; data from the data line LBC is fed into multiplexer 102 at input point 114; data from data line RBT is fed into multiplexer 102 at input point 116; and data from data line RBC is fed into multiplexer 102 at input point 118.

The selection between the right block signals and the left block signals are made utilizing transistors MA, MB, MC, and MD. These transistors are p-channel MOSFETs. A low select signal into input point 120, connected to the gates of transistors MA and MB, turns on transistors MA and MB causing the selection of signals from data lines LBT and LBC to be selected and sent out at output points 122 and 124, as true complement signals in data lines MUXT and MUXC respectively. A low select signal into input point 126, which is connected to the gates of transistors MC and MD, causes the true signal in data line RBT to be sent to sense amplifier 104 via output 122 connected to line MUXT and the complement signal from data line RBC to be sent to sense amplifier 104 via output point 124 connected to line MUXC. The use of multiplexer 102 typically causes a signal drop. It is desirable to have as much signal as possible for speed and reliability.

More information on semiconductor memories and sense amplifiers may be found in the following references: Prince, *Semiconductor Memories*, John Wiley and Sons (2nd Ed. 1991) and Haznedar, *Digital Microelectronics*, The Benjamin/Cummings Publishing Company, Inc. (1991).

Therefore, it would be desirable to have a method and apparatus for multiplexing and sensing a data signal from a memory array without diminishing the data signal being sensed.

SUMMARY OF THE INVENTION

The present invention provides a memory system that includes a memory array having at least two pairs of data lines the first and second pair of data lines correspond to columns in the memory array. The memory array also includes two disabling sense amplifier circuits, a first disabling sense amplifier circuit connected to the first data lines and a disabling sense amplifier circuit connected to the second data lines, wherein the disabling sense amplifier circuits produce output signals and may be enabled and disabled. A selection signal is provided for selectively enabling and disabling the disabling sense amplifier circuits, wherein one pair of data lines may be selected. An amplification circuit connected to the disabling sense amplifier circuits provides for amplifying the output signals from the disabling sense amplifier circuits.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
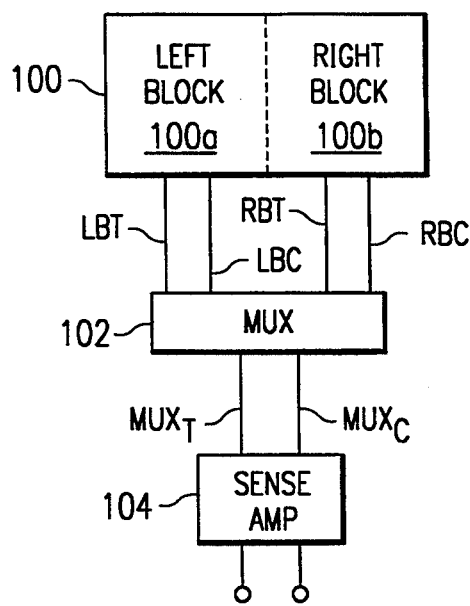
FIG. 1 is a block diagram of a portion of a memory system illustrating a configuration of a memory array, a multiplexer, and a sense amplifier known in the prior art.
Figure 2:
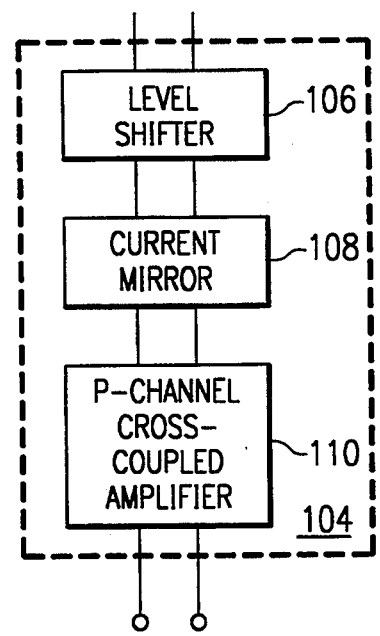
FIG. 2 is a block diagram of a sense amplifier known in the prior art.
Figure 3:
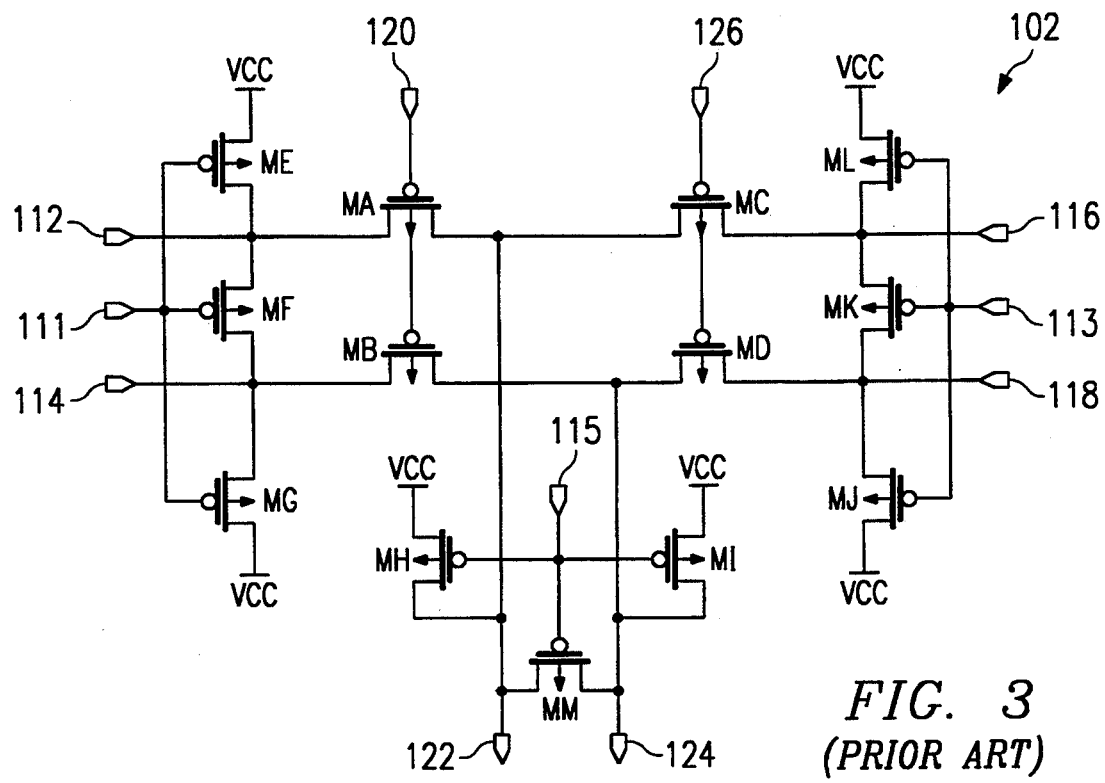
FIG. 3 is a schematic diagram of a multiplexer known in the prior art.

In accordance with a preferred embodiment of the present invention, the multiplexing function is incorporated into the sense amplifier in order to reduce the effects of having a separate multiplexer selecting signals as illustrated in the prior art design in FIG. 1.

Figure 4:
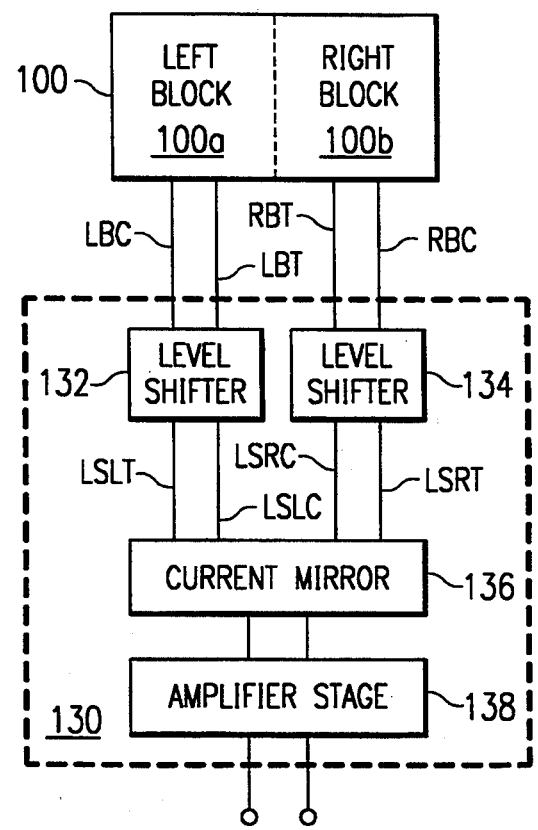
FIG. 4 is a block diagram of a portion of a memory system configured according to the present invention.

Referring now to FIG. 4, a block diagram of a portion of a memory system configured according to the present invention is illustrated. Memory array 100 again includes left block 100a and right block 100b. Signals from data lines LBT, LBC, RBC, and RBT are fed directly into sense amplifier 130 instead of a multiplexer. Signals from data lines LBT and RBT are true signals, while signals from data lines LBC and RBC are complement signals. In accordance with a preferred embodiment of the present invention, sense amplifier 130 includes level shifter 132, level shifter 134, current mirror stage 136, and amplifier stage 138. Multiplexing functions are incorporated into level shifters 132 and 134 in accordance with a preferred embodiment of the present invention.

Figure 5:
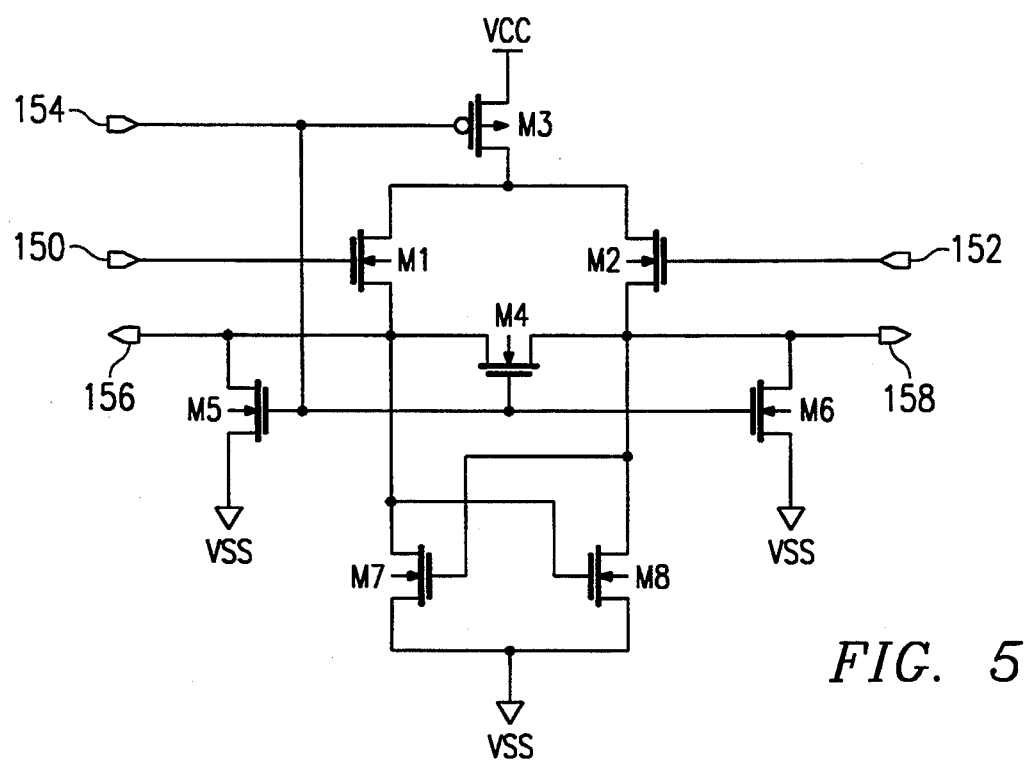
FIG. 5 is a schematic diagram of a cross-coupled level shifter according to the present invention.

Referring now to FIG. 5, a schematic diagram of a cross-coupled level shifter according to the present invention is depicted. Transistors M1–M8 comprise the cross-coupled level shifter. These transistors are n-channel and p-channel MOSFETs. Transistors M1, M2, M4–M8 are n-channel MOSFETs, and transistor M3 is a p-channel MOSFET in accordance with the preferred embodiment of the present invention. Input points 150 and 152 receive either signals from data lines LBT and LBC, or signals from data lines RBT and RBC, respectively. These signals control the gates of transistors M1 and M2 respectively. Transistors M7 and M8 are shown in a cross-coupled connection. Other configurations may be used, such as, tying the drain of each transistor, M7 and M8, to the transistor's own gate or by tying the gates to a bias voltage. The drain of transistor M3 is connected to power supply VCC, and the sources of transistors M5–M8 are connected to power supply VSS. These connections provide power to operate the circuit. Power supply VCC is at a higher voltage relative to power supply VSS.

The level shifter incorporates a multiplexing function in accordance with a preferred embodiment of the present invention. This multiplexing function is controlled by a select signal at input point 154 in level shifters 132 and 134. The select signal controls the gate of transistor M3. If the gate of transistor M3 is turned on, the level shifter allows the passage of the true and complement signals through output points 156 and 158 respectively. A high signal at input point 154 disables the level shifter, forcing the output at output points 156 and 158 to be low. On the other hand, when the signal at input point 154 is low, the level shifter performs normally in accordance with a preferred embodiment of the present invention.

By selecting only one of the two level shifters, 132 or 134, as depicted in FIG. 4, a 2 to 1 multiplexing of the signals from the memory array is achieved without diminishing signal strength in accordance with a preferred embodiment of the present invention. The output from output point 156 is a signal LSLT in level shifter 132 and a signal LSRT, right block true signal, in level shifter 134; the output from output point 158 is a signal LSLC, left block complement signal, in level shifter 132 and a signal LSRC, right block complement signal, in level shifter 134. In accordance with a preferred embodiment of the present invention, more than two level shifters may be used depending on the design of the memory system.

Figure 6:
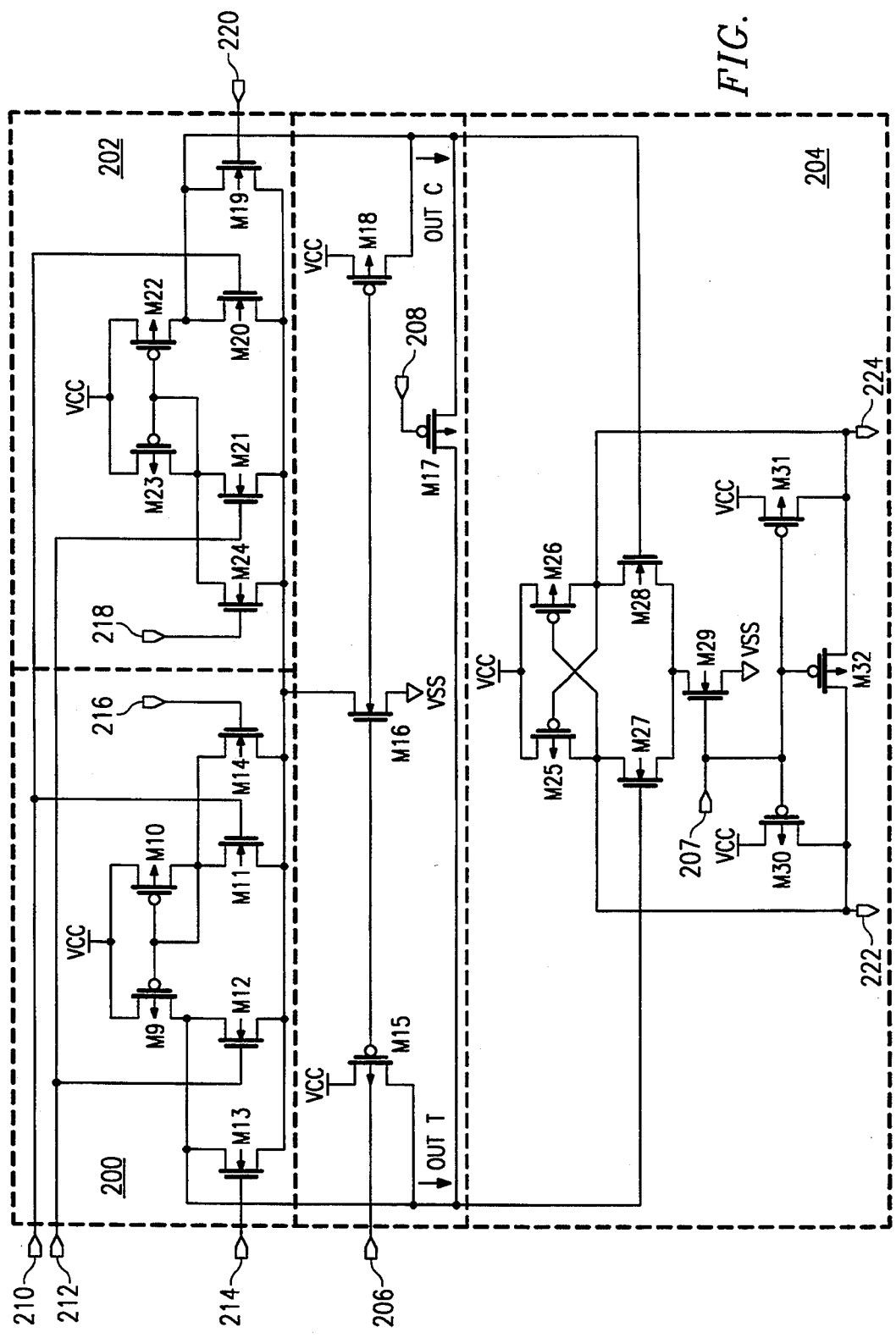
FIG. 6 is a schematic diagram of a pair of current mirrors and a p-channel cross-coupled amplifier according the present invention.

Next, FIG. 6 illustrates a schematic diagram of a pair of current mirrors and a p-channel cross-coupled amplifier within a sense amplifier in accordance with a preferred embodiment of the present invention. Current mirror stage 136 includes current mirrors 200 and 202. Current mirror 200 is constructed from transistors M9–M14; current mirror 202 is constructed from transistors M19–M24. Transistors M9, M10, M22, and M23 are p-channel MOSFETs while the rest of the transistors in the two current mirrors are n-channel MOSFETs in accordance with the preferred embodiment of the present invention. P-channel cross-coupled amplifier 204 is constructed from transistors M25–M32. Transistors M25, M26, M30, M31, and M32, are p-channel transistors, while transistors M27, M28, and M29 are n-channel transistors in p-channel cross-coupled amplifier 204. Transistors M25–M28 form a flip-flop in this circuit. Transistor M32 is employed to provide balancing within the circuit, and transistors M30 and M31 are utilized to pre-charge the circuit.

Transistors M15–M18 are employed to enable, disable, and pre-charge the sense amplifier in accordance with a preferred embodiment of the present invention.

The current mirrors and the amplifier are powered by connecting the drains of transistors M9, M10, M15, M18, M22, M23, M25, M26, M30, and M31 to power supply VCC, while the sources of transistors M16, and M29 are connected to power supply VSS. Power supply VCC is typically at a higher voltage than power supply VSS.

Signals at input points 206, 207, and 208 enable and disable the circuits. Input points 210 and 212 carry signals LSRC and LSRT from level shifter 134 while input points 214 and 218 carry signal LSLC from level shifter 132. Input points 216 and 220 carry signal LSRT from level shifter 132. Signal LSRC controls the gates of transistors M11 and M20; signal LSRT controls the gates of transistors M12 and M21. Transistors M13 and M24 are controlled by signal LSLT; transistors M14 and M19 are controlled by signal LSLC.

In accordance with a preferred embodiment of the present invention, current mirrors 200 and 202 are current mirrors with additional transistors added in parallel to control the output of the current mirrors. Transistors M12 and M13 are connected in parallel; transistors M11 and M14 are in parallel; transistors M21 and M24 are connected in parallel; and transistors M20 and M19 are connected in parallel. These transistors control the current flow in the current mirrors.

If level shifter 134 is not selected and level shifter 132 has been selected, the signals at input points 210 and 212 are low. A low signal is a signal that turns the transistor off. As a result, transistors M11, M12, M20, and M21 are turned off. The signals at input points 214, 216, 218 and 220 correspond to the output from level shifter 132, resulting in various levels of current flowing through transistors M13, M14, M24, and M19 depending on the voltage at the gates of transistors by signals supplied by lines LSLT and LSLC. The output signals, OUTT and OUTC, from these two current mirrors control the gates of transistors M27 and M28 in p-channel cross-coupled amplifier 204 resulting in output signals DATAT and DATAC at output points 222 and 224 respectively. Signal DATAC is the complement of signal DATAT.

Figure 7:
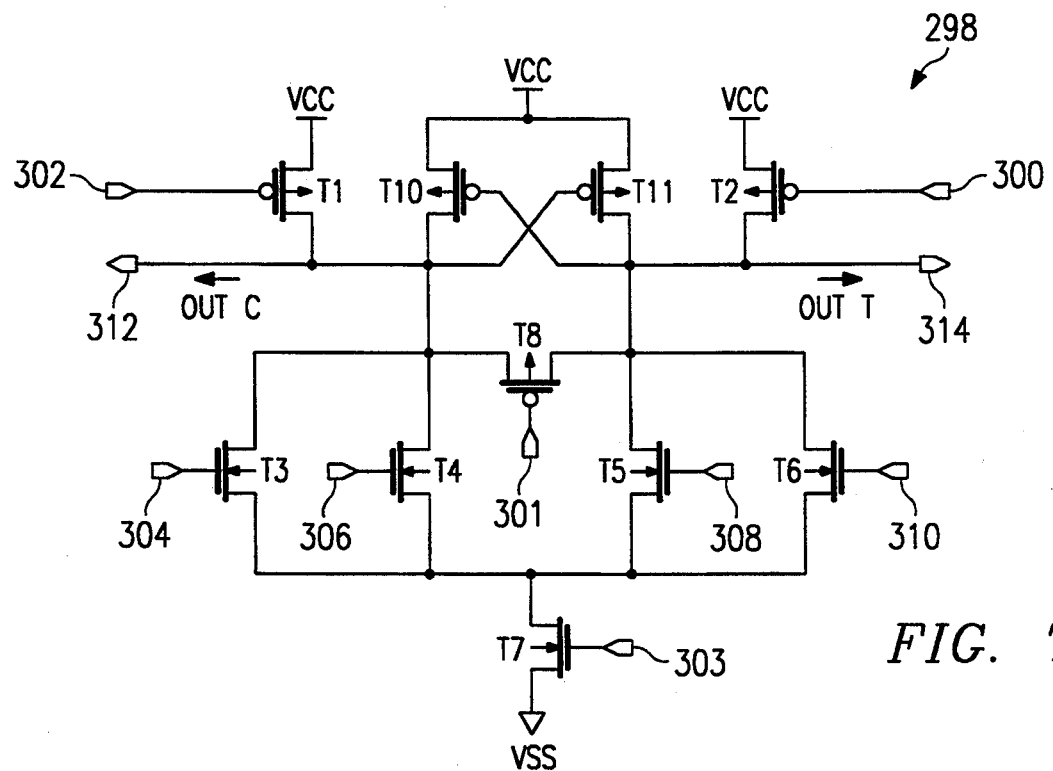
FIG. 7 is a schematic diagram of a p-channel cross-coupled amplifier according to the present invention.

Current mirror stage 136 in FIG. 4 may be replaced by a number of different stages in accordance with a preferred embodiment of the present invention. For example, a multiplexing sense amplifier circuit such as a p-channel cross-coupled amplifier 298, depicted in FIG. 7, may be utilized in place of the two current mirrors 200 and 202 forming the multiplexing sense amplifier circuit illustrated in FIG. 6. P-channel cross-coupled amplifier 298 is constructed from transistors T1-T11. Transistors T1, T2, TS, T10, and T11 are p-channel MOSFETs. The remaining transistors are n-channel MOSFETs. P-channel cross-coupled amplifier 298 is powered by connecting transistors T1, T2, T10, and T11 to power supply VCC and connecting the drain of transistor T7 to power supply VSS.

P-channel cross-coupled amplifier 298 is enabled when a select signal is high at input points 300, 301, 302, and 303. These signals control the gates of transistors T1, T2, T7, and T8. Input points 304 and 306 are connected to the gates of transistors T3 and T4 respectively; input points 308 and 310 are connected to the gates of transistors T5 and T6 respectively. Again, a parallel configuration of transistor T3 in parallel with transistor T4 and transistor T5 in parallel with transistor T6 is employed in accordance with a preferred embodiment of the present invention. Signal LSLT enters input point 304; signal LSRT enters input point 306; signal LSRC enters input point 308; and signal LSLC enters input point 310. If level shifter 134 is disabled and level shifter 132 is selected, signals LSRT and LSRC will be low, causing transistors T4 and T5 to be turned off. Signals LSLT and LSLC will correspond to the output from level shifter 132, allowing various amounts of current to flow through transistors T3 and T6 in response to different voltages being applied to the gates of these two transistors in accordance with a preferred embodiment of the present invention.

Transistors T10 and T11 are the cross-coupled p-channel MOSFETs within the amplifier. Signal OUTC travels from output point 312 to transistor M28 in amplifier 204 in FIG. 6. Signal OUTT travels from output point 314 to transistor M27 in amplifier 204 in FIG. 6. The depicted embodiment in FIG. 6 illustrates employing an amplifier connected to the current mirrors to produce a logic signal. According to the present invention, some other logic circuit may be used in place of amplifier 204. Furthermore, the circuit below current mirrors 200 and 202 may be eliminated, and the output from current mirrors 200 and 202 may be directly used as the output of the sense amplifier.

Figure 8:
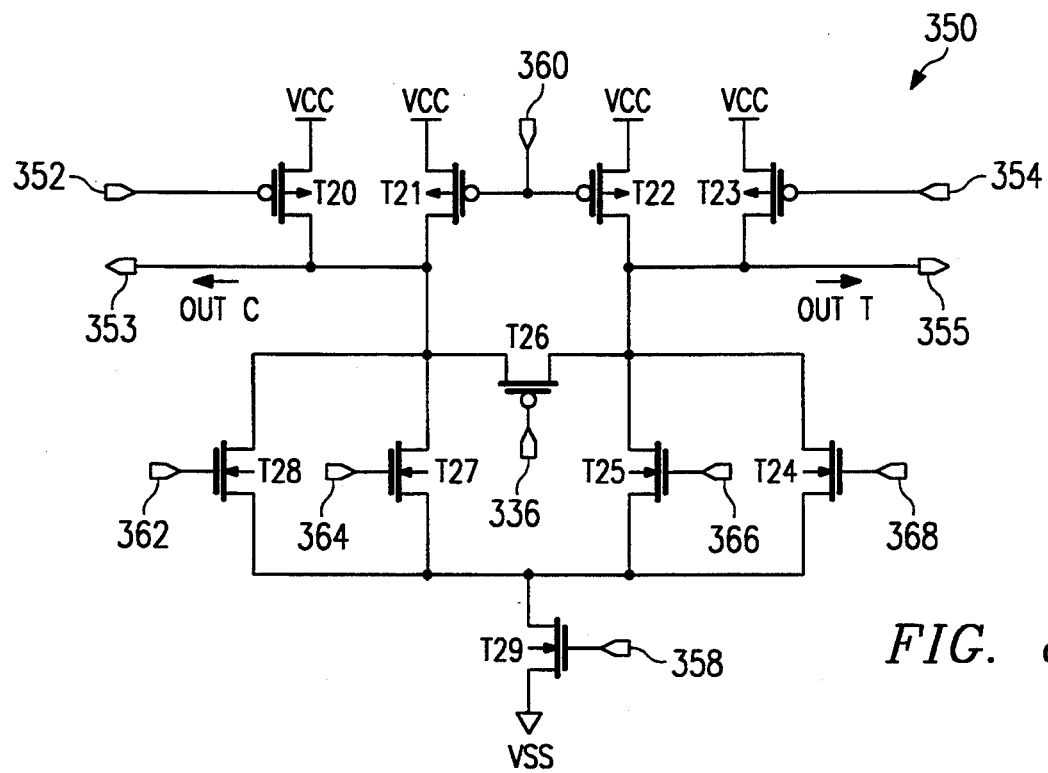
FIG. 8 is a schematic diagram of a differential amplifier according to the present invention.

Referring now to FIG. 8, a schematic diagram of a multiplexing differential amplifier, which may be substituted in place of current mirrors 200 and 202 in FIG. 6, is illustrated in accordance with a preferred embodiment of the present invention. Differential amplifier 350 is comprised of transistors T20-T29. Transistors T20-T23 and T26 are p-channel MOSFETs while the remaining transistors are n-channel MOSFETs. This circuit is powered by connecting the drains of transistors T20, T21, T22, and T23 to power supply VCC and connecting the source of transistor T29 to power supply VSS.

Transistors T20, T23, T26 and T29 enable and disable differential amplifier 350. These transistors are controlled by control signals at input points 352, 354, 356, and 358. A bias signal (or ground) is applied to the amplifier at input point 360, which controls the gates of transistors T21 and T22. Transistor T28 is controlled by signal LSLT at input point 362. Transistor T27 is controlled by signal LSRT at input point 364. Transistor T25 is controlled by signal LSRC at input point 366. Transistor T24 is controlled by signal LSLC at input point 368. Output point 353 is connected to the gate of transistor M28 in amplifier 204 and provides a complement output signal OUTC, while output point 355 is connected to the gate of transistor M27 in amplifier 204 and provides an output signal, OUTT.

Figure 9:
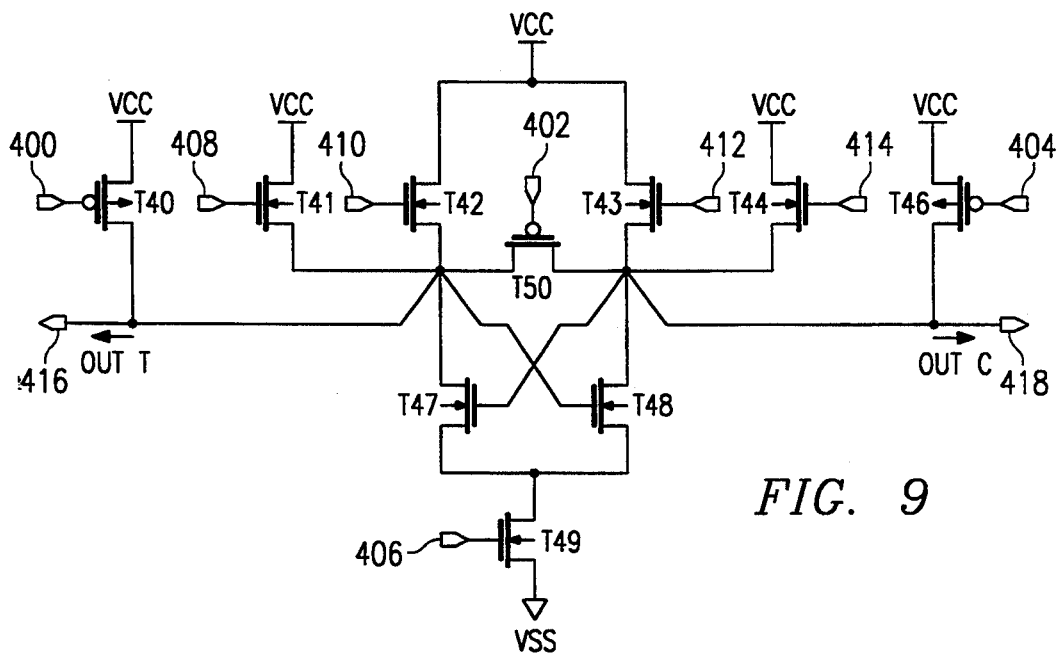
FIG. 9 is a schematic diagram of a level shifter according to the present invention.

Referring now to FIG. 9, transistors T40-T50 are utilized to form a multiplexing level shifter that may be utilized in place of current mirrors 200 and 202 in FIG. 6. Transistors T40, T46, and T50 are p-channel MOSFETs, while transistors T41, T42, T43, T44, T47, T48, and T49 are n-channel MOSFETs in accordance with a preferred embodiment of the present invention. Transistors T40, T46, T49, and T50 are employed to enable and disable the circuit. Control signals at input points 400, 402, 404, and 406 control the gates of these transistors. The circuit is powered by connecting the drains of transistors T40, T41, T44, and T46 to power supply VCC, while connecting the source of transistor T49 to power supply VSS.

Transistor T41 is controlled by signal LSLT applied to input point 408. Transistor T42 is controlled by signal LSRT applied to input point 410; transistor T43 is controlled by signal LSRC applied to input point 412; and transistor T44 is controlled by signal LSLC applied to input point 414. Transistors T41 and T42 are in parallel; transistors T43 and T44 are in parallel. Output point 416 is connected to the gate of transistor M27 in amplifier 204 in FIG. 6. Output point 418 is connected to the gate of transistor M28 in amplifier 204 is FIG. 6. The output signals at output points 416 and 418 are determined by the input signals at input points 408, 410, 412, and 414. For example, if level shifter 134 is disabled and level shifter 132 is selected, transistors T41 and T44 would be turned on, while transistors T42 and T43 would be turned off. The output at output point 416 would depend on signal LSLT at input point 408, which controls transistor T41. The output at output point 418 would depend on signal LSLC at input point 414, controlling transistor T44.

Figure 10:
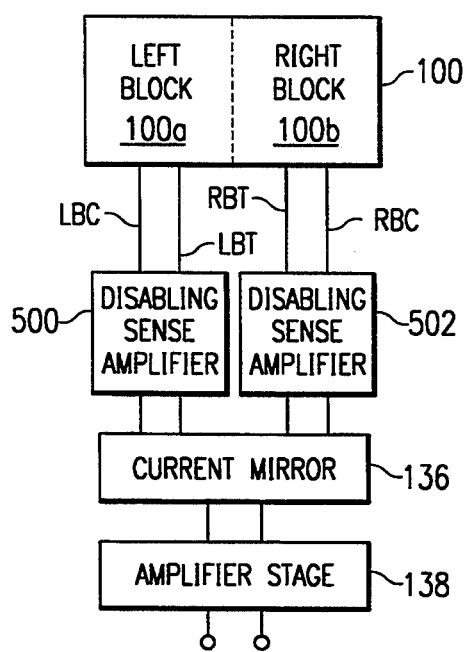
FIG. 10 is a block diagram of a portion of a memory system configured according to the present invention.

FIG. 10 is a block diagram of an alternative embodiment of a portion of a memory system similar to the memory system in FIG. 4, except that level shifter 132 and level shifter 134 have been replaced by disabling sense amplifier (DSA) 500 and disabling sense amplifier (DSA) 502. Multiplexing functions are incorporated into DSAs 500 and 502 in accordance with a preferred embodiment of the present invention. DSA 500 and DSA 502 may be alternately enabled and disabled to select signals from data lines LBC and LBT and data lines RBC and RBT.

Figure 11:
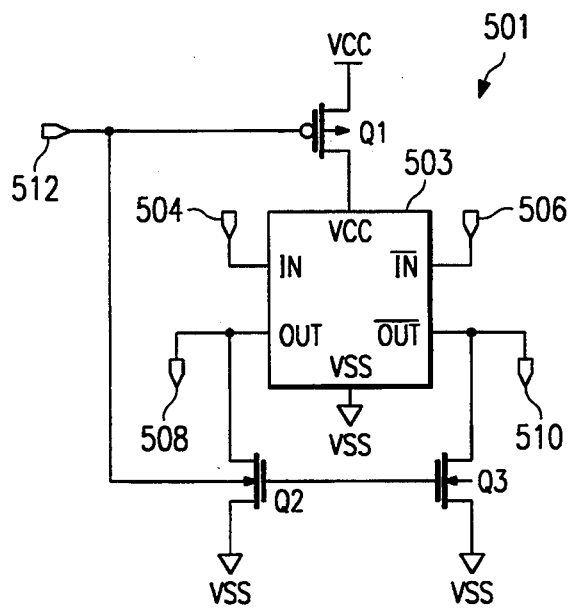
FIG. 11 is a block diagram of a disabling sense amplifier according to the present invention.

Referring now to FIG. 11, a block diagram of a DSA according to the present invention is illustrated. DSA 501 includes amplifier block 503, which has a true input (IN) connected to input point 504 and a complement input (/IN) connected to input point 506. A data line such as LBT in FIG. 10 may be connected to input point 504 and a data line such as LBC in FIG. 10 may be connected to input point 506. A true output (OUT) and a complement output (/OUT) may be connected to current mirror 136 in FIG. 10 via output points 508 and 510.

Amplifier block 503 also is connected to transistors Q1-Q3, which are MOSFETs. Transistor Q1 is a p-channel MOSFET, while transistors Q2 and Q3 are n-channel MOSFETs. Transistor Q1 has a source connected to power supply voltage VCC, while transistors Q2 and Q3 have sources connected to power supply voltage VSS.

The gates of these transistors are controlled by a select signal applied to point 512. DSA 501 may be selected or enabled by applying a low signal to point 512. A low signal turns on transistor Q1 and provides power to amplifier block 503. Additionally, a low signal at point 512 turns off transistors Q2 and Q3 and allows signals connected to input points 504 and 506 to be sent through amplifier block 503 to output points 508 and 510. On the other hand, a high signal applied to point 512, results in power to amplifier block 503 being turned off and the outputs at output points 508 and 510 being pulled low by transistors Q2 and Q3, which are turned on in response to the low signal applied to point 512.

Figure 12:
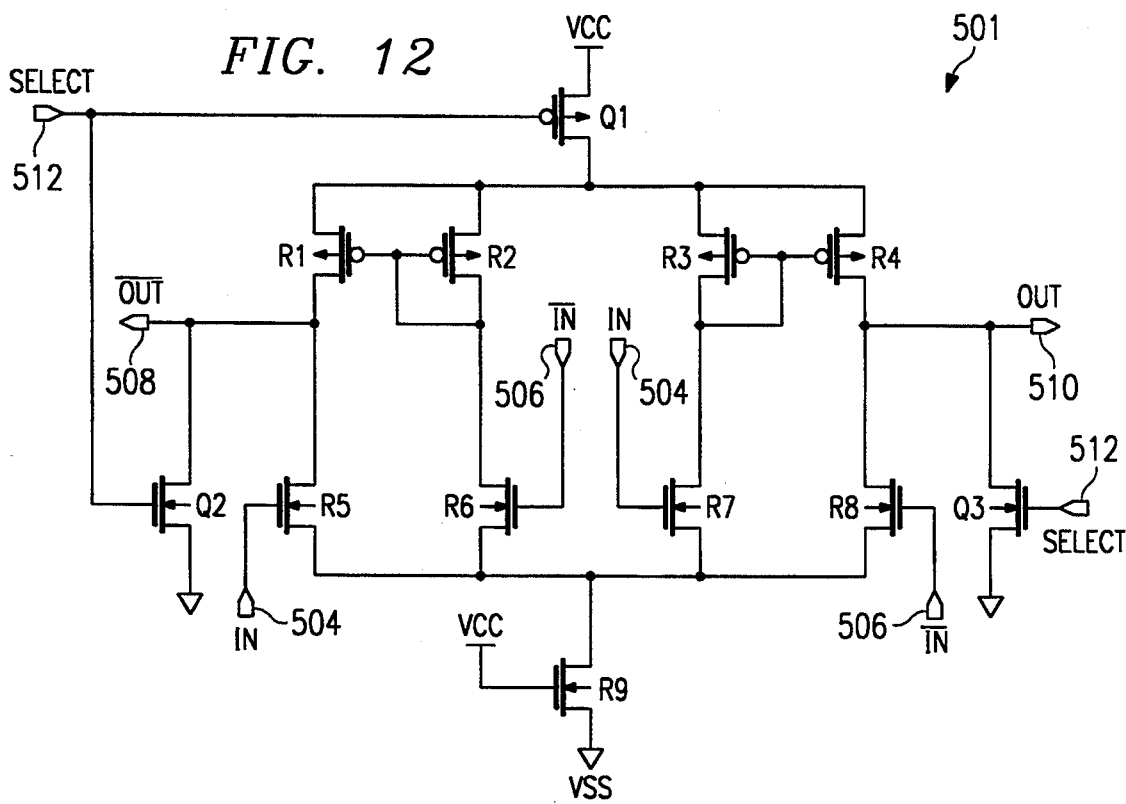
FIG. 12 is a schematic diagram of a disabling sense amplifier incorporating two current mirrors.

Referring now to FIG. 12, a schematic diagram of a preferred embodiment of DSA 501 is illustrated. Amplifier block 503 from FIG. 11 includes transistors R1-R9. Transistors R1-R4 are p-channel MOSFETs while transistors R6-R9 are n-channel MOSFETs. This particular configuration of DSA 501 includes two current mirrors. One current mirror is formed by transistors R1 and R2, while a second current mirror is formed by transistors R3 and R4. Input point 504 is connected to the gates of transistors R5 and R7, while the input point 506 is connected to the gates of transistors R6 and R8. The circuit is powered by connecting the sources of transistors R1-R4 to the drain of transistor Q1, which provides a connection to power supply voltage VCC. The drain of transistor R9 is connected to power supply voltage VSS. R9 acts as a current source and may not be required in some cases.

Figure 13:
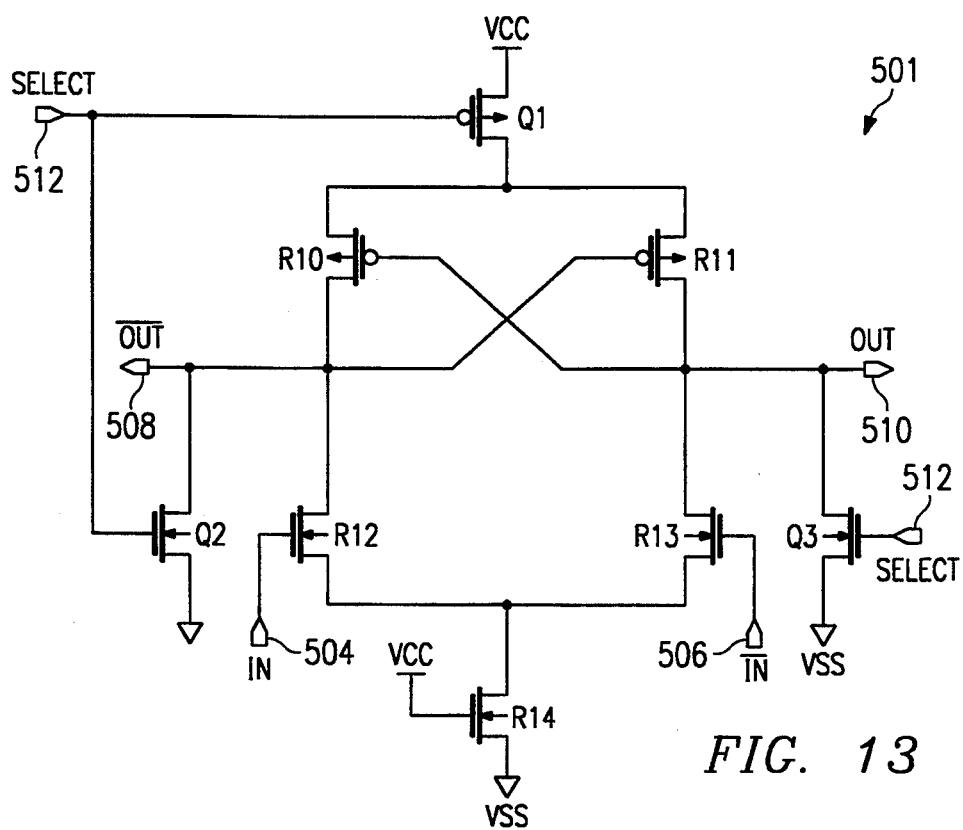
FIG. 13 is a schematic diagram of a disabling sense amplifier employing a p-channel cross-coupled amplifier.

FIG. 13 is a schematic diagram illustrating another configuration for DSA 501. Amplifier block 503 includes transistors R10-R14. Transistors R10 and R11 are p-channel MOSFETs, while transistors R12-R14 are n-channel MOSFETs. Amplifier block 503 incorporates a p-channel cross-coupled amplifier. Transistors R10-R11 are cross-coupled p-channel MOSFETs within the amplifier block 503. The circuit is powered by connecting the sources of transistors R10 and R11 to the drain of transistor Q1, which provides a connection to power supply voltage VCC. The source of transistor R14 is connected to power supply voltage VSS. R14 acts as a current source and may not be required in some cases.

Figure 14:
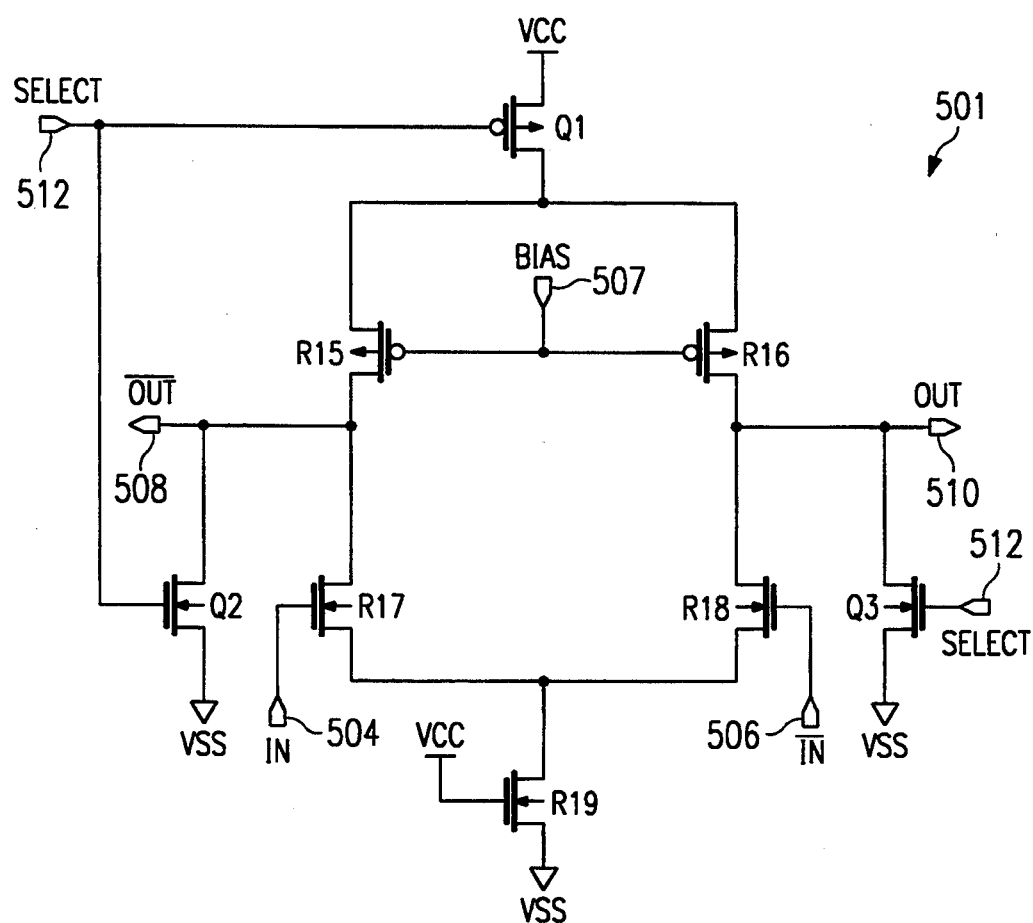
FIG. 14 is a schematic diagram of a disabling sense amplifier using a differential amplifier.

FIG. 14 is a schematic diagram illustrating another preferred embodiment for DSA 501 in FIG. 11. Amplifier block 503 includes a differential amplifier comprised of transistors R15-R19. Transistors R15 and R16 are p-channel MOSFETs, while the remaining transistors are n-channel MOSFETs. This circuit is powered by connecting the sources of transistors R15 and R16 to transistor Q1. Transistor Q1 provides a connection to power supply voltage VCC. The sources of transistors R17 and R18 are connected to transistor R19, which provides a connection to power supply voltage VSS. R19 acts as a current source and may not be needed in some cases. A bias signal (or ground) may be applied to the differential amplifier at point 507, which controls the gates of transistors R15 and R16.

In each amplifier depicted in FIGS. 11-14, disablement of the DSA is accomplished by sending a high signal through point 512. As a result, transistors Q2 and Q3 are turned on pulling the outputs at output points 508 and 510 low. These low signals disable later stages such as current mirror 136 in FIG. 10. As a result, when level shifting is not required, DSAs may be employed to provide selection of data from various data lines in a memory system. The DSA's work in conjunction with the multiplexing sense amplifiers shown in FIGS. 6-9.

Signals may be selected by enabling and disabling a pair of level shifters, instead of using a separate multiplexer. Transistors controlling the output in later stages are placed in parallel and controlled by the output signals from the level shifters. Although, two level shifters are depicted, other numbers of level shifters may be utilized in different memory array configurations. Although one depicted embodiment illustrates the selection of signals by enabling and disabling a pair of level shifters, other circuits other than level shifters may be manipulated in a similar function within a sense amplifier to provide selection of signals such as the DSAs depicted in FIGS. 10-14.

According to the present invention, the level shifters may be replaced with DSAs in cases where level shifting is not required. The DSAs are employed to enable and disable later stages by providing true and complement outputs that are low, rendering the pair of inputs in the multiplexing sense amplifier nonconductive.

In addition, the depicted embodiment illustrates an implementation involving pairs of data lines, carrying true and complement signals. Those of ordinary skill in the art will appreciate that a single data line implementation, instead of a pair of data lines, may be employed according to the present invention. A differential amplifier may be used to produce a true and complement signal from a single data line.

One advantage of the present invention is that it provides a faster and more sensitive sense amplifier because signal losses resulting from signals propagating through a transmission gate in a multiplexer stage are eliminated. Additionally, the present invention provides for smaller and simpler circuitry for selecting and sensing signals from data lines in multiple blocks of memory. The present invention is depicted using MOS technology. Other types of technology and transistors may be utilized in accordance with a preferred embodiment of the present invention.

While the invention has been particularly shown and described with reference to a preferred embodiment, it will be understood by those skilled in the art that various changes in form and detail may be made therein without departing from the spirit and scope of the invention.

What is claimed is:

1. A memory system comprising:
   a memory array having at least two pairs of data lines, first and second pairs of data lines corresponding to columns in the memory array;
   at least two disabling sense amplifier circuits, a first disabling sense amplifier circuit connected to the first pair of data lines and a second disabling sense amplifier circuit connected to the second pair of data lines, wherein the two disabling sense amplifier circuits produce output signals and are enabled and disabled;
   a selection signal for selectively enabling and disabling the disabling sense amplifier circuits, wherein one pair of data lines may be selected; and
   an amplification circuit connected to the disabling sense amplifier circuits for amplifying the output signals from the disabling sense amplifier circuits,
   wherein the first pair of data lines includes a true data line and a complement data line; the second pair of data lines includes a true data line and a complement data line; and each disabling sense amplifier circuit includes:
   an amplifier circuit having a true input and complement input connected to a true data line and complement data line;
   a first transistor having a first source/drain connected to an upper power supply voltage and second source/drain connected to the amplifier circuit;
   a second transistor having a first source/drain connected to the true output of the amplifier circuit and a second source drain connected to a lower power supply voltage; and
   a third transistor having a first source/drain connected to the complement output of the amplifier circuit and a second source drain connected to a lower power supply voltage.

2. The memory system of claim 1, wherein the amplifier circuit is a multiplexing amplifier.

3. The memory system of claim 1, wherein the upper power supply voltage is disconnected from the disabling sense amplifier when the disabling sense amplifiers are disabled.

4. The memory system of claim 1, wherein the amplifier circuit includes two current mirrors.

5. The memory system of claim 1, wherein the amplifier circuit includes a p-channel cross-coupled amplifier.

6. The memory system of claim 1, wherein the amplifier circuit includes a differential amplifier.

7. The memory system of claim 1, wherein the first transistor is a p-channel field effect transistor.

8. The memory system of claim 1, wherein the second and third transistors are n-channel field effect transistors.

9. A memory system comprising:
   a memory array having at least two pairs of data lines, first and second pairs of data lines corresponding to columns in the memory array;
   at least two disabling sense amplifier circuits, a first disabling sense amplifier circuit connected to the first pair of data lines and a second disabling sense amplifier circuit connected to the second pair of data lines, wherein the two disabling sense amplifier circuits produce output signals and are enabled and disabled;
   a selection signal for selectively enabling and disabling the disabling sense amplifier circuits, wherein one pair of data lines may be selected; and
   an amplification circuit connected to the disabling sense amplifier circuits for amplifying the output signals from the disabling sense amplifier circuits,
   wherein the first pair of data lines includes a first true input line and a first complement input line and the second pair of data lines includes a second true input line and a second complement line, and the at least two disabling sense amplifiers include:
   a first disabling sense amplifier circuit connected to the first true input line and the first complement input line and a second disabling sense amplifier circuit connected to the second true input line and the second complement input line, each disabling sense amplifier circuit having two outputs, a true output and a complement output, and a select input, responsive to a select signal, for enabling or disabling the disabling sense amplifier circuit, wherein the first disabling sense amplifier circuit is disabled when the second disabling sense amplifier circuit is enabled and the first disabling sense amplifier circuit is enabled when the second disabling sense amplifier circuit is disabled and wherein selection of signals from one of the two disabling sense amplifier circuits may be accomplished; and
   a second stage having a true output and a complement output, the second stage being connected to the true and complement outputs of the first and second disabling sense amplifiers, wherein the true output and the complement output of the second stage are controlled by the outputs of the first and second disabling sense amplifiers.

10. The memory system of claim 9, wherein both outputs of a disabling sense amplifier circuit are forced low in response to disablement of the disabling sense amplifier circuit.

11. The memory system of claim 9, wherein the second stage is a multiplexing sense amplifier.

12. The memory system of claim 8 further comprising:
   an amplifier stage connected to the true output and the complement output of the second stage, the amplifier having a pair of outputs, wherein the amplifier generates logic 1 and logic 0 signals at the pair of outputs in the amplifier stage in response to signals from the true output and complement output of the second stage.

13. The memory system of claim 10, wherein said second stage comprises a first pair of transistors and a second pair of transistors, each pair of transistors having a first transistor connected in parallel with a second transistor in the pair, the gate of the first transistor in the first pair being connected to the true output of the first disabling sense amplifier circuit, the gate of the second transistor in the first pair being connected to the true output of the second disabling sense amplifier circuit, the gate of the first transistor in the second pair being connected to the complement output of the first disabling sense amplifier circuit, and the gate of the second transistor in the second pair being connected to the complement output of the second disabling sense amplifier circuit, wherein the two pairs of transistors control the true output and the complement output of the second stage.

14. The memory system of claim 12, wherein the amplifier stage is a p-channel cross-coupled amplifier comprising two p-channel FETs, each p-channel metal-oxide transistor having a gate connected to a drain of the other p-channel FET, and two n-channel FETs, each n-channel FET having a drain connected to the drain of a p-channel FET, wherein the true output of the second stage is connected to the gate of the first n-channel FET and the complement output of the second stage is connected to the gate of the second n-channel FET.

15. The memory system of claim 13, wherein the second stage comprises a pair of current mirrors, a first current mirror and a second current mirror, the first current mirror having an output controlled by the outputs of the first and second disabling sense amplifier circuits and the second current mirror having an output controlled by the outputs of the first and second disabling sense amplifier circuits.

16. The memory system of claim 15, wherein each mirror includes four control transistors for controlling the output of the current mirror.

17. The memory system of claim 16, wherein the first control transistor has its gate connected to the true output of the first disabling sense amplifier circuit, the second control transistor is connected in parallel with the first control transistor and has its gate connected to the true output of the second disabling sense amplifier circuit, the third control transistor has a gate connected to the complement output of the first disabling sense amplifier circuit, and the fourth control transistor is connected in parallel with the third control transistor and has a gate connected to the complement output of the second disabling sense amplifier circuit.

18. The memory system of claim 1, wherein the amplification circuit is connected to the disabling sense amplifier circuits by a current mirror.

* * * * *